(12) United States Patent
Leung et al.

(10) Patent No.: US 6,897,154 B2
(45) Date of Patent: May 24, 2005

(54) SELECTIVE ETCHING OF LOW-K DIELECTRICS

(76) Inventors: Terry Leung, 3200 Payne Ave., Apt. 61, San Jose, CA (US) 95117; Qiqun Zheng, 2192 Hunter Pl., Santa Clara, CA (US) 95054; Chang-Lin Hsieh, 1071 Regeny Knoll Dr., San Jose, CA (US) 95129; Yan Ye, 13271 Via Arriba Dr., Saratoga, CA (US) 95070; Takehiko Komatsu, 101 17-21 Mitsuzawaminami, Kanagawa, Yokohama (JP), 221-0854

( * ) Notice: Subject to any disclaimer, the term of this patent is extended or adjusted under 35 U.S.C. 154(b) by 67 days.

(21) Appl. No.: 10/172,243

(22) Filed: Jun. 14, 2002

(65) Prior Publication Data

US 2003/0235993 A1 Dec. 25, 2003

(51) Int. Cl.$^7$ .................. H01L 21/302; H01L 21/3065; C09K 13/00
(52) U.S. Cl. .............. 438/706; 438/710; 438/712; 438/723; 252/79.1
(58) Field of Search .................. 438/706, 710, 438/712, 723; 252/79.1

(56) References Cited

U.S. PATENT DOCUMENTS

| 5,814,563 | A | 9/1998 | Ding et al. ............ 438/714 |
| 5,843,847 | A | 12/1998 | Pu et al. ............ 438/723 |
| 6,284,149 | B1 * | 9/2001 | Li et al. ............ 216/64 |
| 6,287,990 | B1 | 9/2001 | Cheung et al. ............ 438/780 |
| 6,303,523 | B2 | 10/2001 | Cheung et al. ............ 438/780 |
| 6,485,988 | B2 * | 11/2002 | Ma et al. ............ 438/3 |

* cited by examiner

Primary Examiner—Nadine G. Norton
Assistant Examiner—Lynette T. Umez-Eronini
(74) Attorney, Agent, or Firm—Moser, Patterson & Sheridan LLP; Joseph Bach

(57) ABSTRACT

The present invention provides a low-k dielectric etching process with high etching selectivities with respect to adjacent layers of other materials, such as an overlying photoresist mask and an underlying barrier/liner layer. The process comprises the step of exposing a portion of the low-k dielectric layer to a plasma of a process gas that includes a fluorocarbon gas, a nitrogen-containing gas, and an inert gas, wherein the volumetric flow ratio of inert:fluorocarbon gas is in the range of 20:1 to 100:1, and the volumetric flow ratio of fluorocarbon:nitrogen-containing gas is selected to provide a low-k dielectric to photoresist etching selectivity ratio greater than about 5:1 and a low-k dielectric etch rate higher than about 4000 Å/min.

32 Claims, 5 Drawing Sheets

SELECTIVE ETCHING OF LOW-K DIELECTRICS

The present application relates to semiconductor processing technologies, and particularly to etching patterns in a layer of dielectric material having low dielectric constant.

BACKGROUND

The move toward faster operating speeds and higher transistor packing densities in the semiconductor chip industry has prompted the introduction of new materials, such as low-k dielectrics. As the minimum feature size on integrated circuits shrinks below 0.18 μm, the wiring between transistors is not only more closely packed, but the wires may also function as the plates of a capacitor making them more prone to crosstalk. The crosstalk problem may be reduced by using lower resistance metal (such as copper) for interconnect, and lower permittivity dielectric material for isolation, such as dielectric materials with a relative permittivity k<3.

A problem with low permittivity or low-k dielectrics results from the desire to reduce the relative permittivity k to as low a value as possible while still maintaining the characteristics of a good insulator. Also, unlike dielectrics such as silicon dioxide, which are comparatively hard and inert, low-k dielectrics are more difficult to handle during semiconductor processing because they are typically much softer, more porous, and more prone to chemical reactions during high temperature processes needed for chip making.

Furthermore, etching trenches or vias in low-k dielectrics can be a challenge due to the more complicated chemical composition of the dielectric material. For example, etching low-k dielectrics using conventional dielectric etching processes often produces non-volatile etch products. The non-volatile etch products tend to deposit on the surfaces of etched features, causing problems such as striation, slow etch rate, or even etch stop. Since a low-k dielectric etching process is typically carried out in a vacuum chamber, frequent chamber cleaning is also required to remove the deposited non-volatile etch products from the surfaces inside the vacuum chamber. Chamber cleaning consumes time and resources, and can slow down the throughput in device fabrication.

Oxygen can be used to remove the etch products from feature surfaces and possibly other surfaces inside the etching chamber. But, since low-k dielectrics are typically etched using a photoresist mask, the added oxygen also attacks the photoresist, causing faster mask erosion. As the feature sizes shrink, the photoresist mask gets thinner, and the ratio of the rate of etching the low-k dielectric layer to the rate of mask erosion becomes a major concern in low-k dielectric etching processes.

The ratio of the rate of etching the low-k dielectric layer to the rate of etching one of the adjacent layers of other materials is called etching selectivity. In addition to the etching selectivity with respect to the overlying mask layer, etching selectivity with respect to an underlying material is also critical for a low-k dielectric etching process. For example, a liner/barrier layer has been used between a conductive material such as the copper lines and a low-k dielectric material to prevent by-products, such as moisture produced during the formation of the low-k dielectric, from diffusing onto the conductive material. Such a liner/barrier layer needs to have a low dielectric constant in order to maintain the low-k characteristic of the dielectric-barrier/liner stack between metal lines. The low-k barrier/liner layer also acts as an etch-stop layer for the low-k dielectric etching process, so that the underlying metal will not be exposed to the etching environment. Therefore, the low-k dielectric etching process should also be highly selective with respect to the low-k barrier/liner layer.

SUMMARY

In one embodiment of the present invention, the low-k dielectric layer is formed on a substrate with an underlying barrier/liner layer and an overlying photoresist mask. The present invention provides a low-k dielectric etching process with high etching selectivities with respect to adjacent layers of other materials, such as the overlying photoresist mask and the underlying barrier/liner layer. A process for etching the low-k dielectric layer comprises a main etch step, in which the substrate is exposed to a plasma of a first process gas for a period of time. The first process gas includes a fluorocarbon gas, a nitrogen-containing gas, and an inert gas, wherein the volumetric flow ratio of inert:fluorocarbon gas is in the range of 20:1 to 100:1, and the volumetric flow ratio of fluorocarbon:nitrogen-containing gas is selected to provide a low-k dielectric to photoresist etching selectivity ratio greater than about 5:1 and a low-k dielectric etch rate higher than about 4000 Å/min. The main etch step is typically followed by an over etch step, in which the substrate is exposed to a plasma of a second process gas. The second process gas includes a fluorocarbon gas and a nitrogen-containing gas, wherein the volumetric flow ratio of fluorocarbon:nitrogen-containing gas is about 1:18 to about 1:8. The over etch step provides a low-k dielectric to barrier/liner etching selectivity greater than about 6:1 with a low-k dielectric etch rate higher than 200 Å/min.

DRAWINGS

Additional objects and features of the invention will be more readily apparent from the following detailed description and appended claims when taken in conjunction with the drawings, in which:

FIGS. 1(a), 1(b), 1(c) and 1(d) are schematic views in vertical cross-section of a dielectric layer on a substrate at different stages of an etching process;

DESCRIPTION

Figure 1:
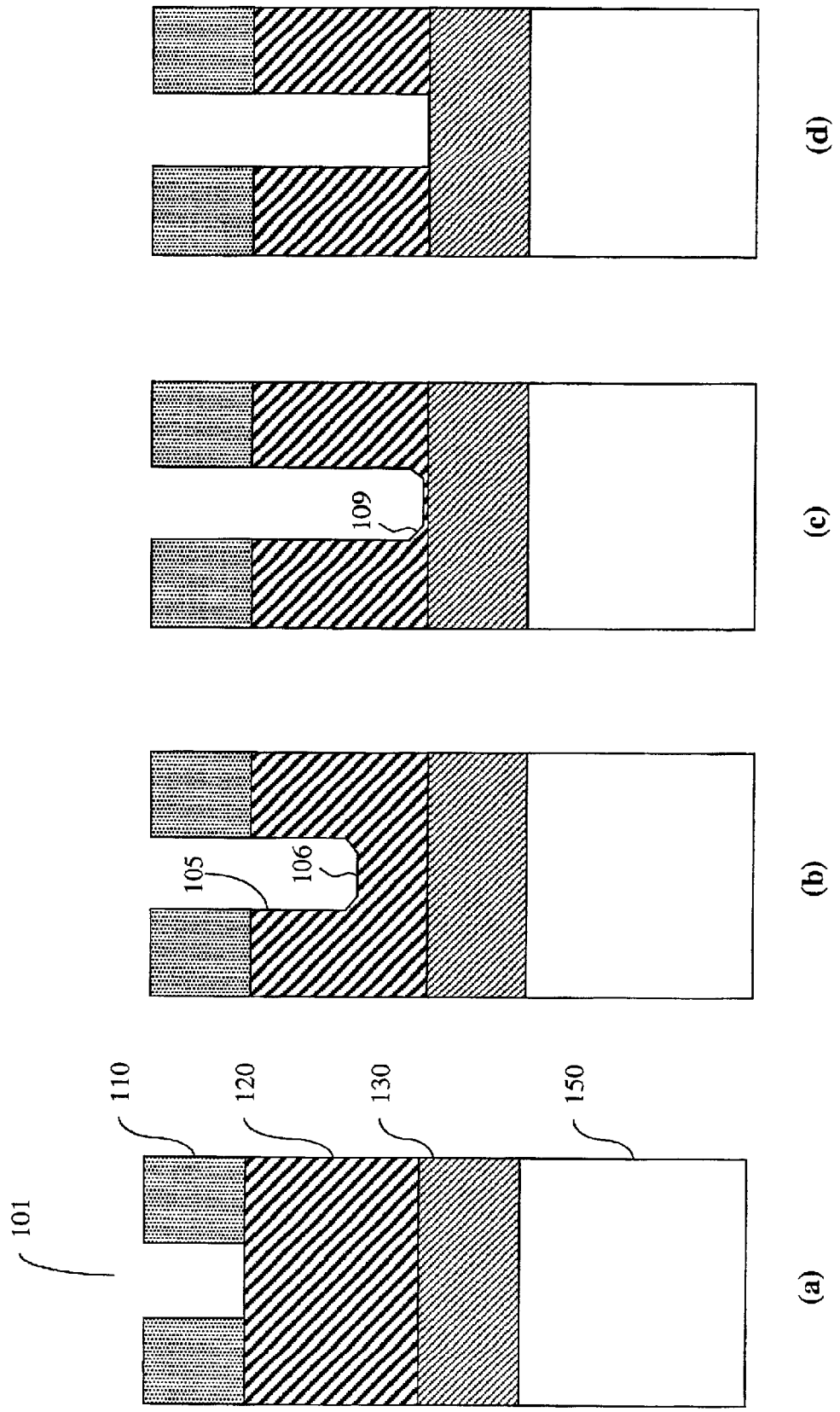

FIGS. 1(a), 1(b), 1(c) and 1(d) illustrate a low-k dielectric layer 120 on a substrate 150 at different, successive stages of a low-k dielectric etching process. A patterned mask layer 110 partially covers the dielectric layer 120 and defines the openings for features to be etched, such as feature 101. In some applications, the dielectric layer 120 is separated from the substrate by a barrier/liner layer 130. Metal lines (not shown) may also lie beneath portions of the barrier/liner layer.

In one embodiment of the present invention, the thickness of the low-k dielectric layer 120 is typically about 1 μm, the thickness of the mask layer 110 before etching is typically about 2500 to 7000 Å, and the thickness of the barrier/liner layer is usually a few hundred Angstroms. As is apparent, these layers are not drawn to scale.

Figure 2:
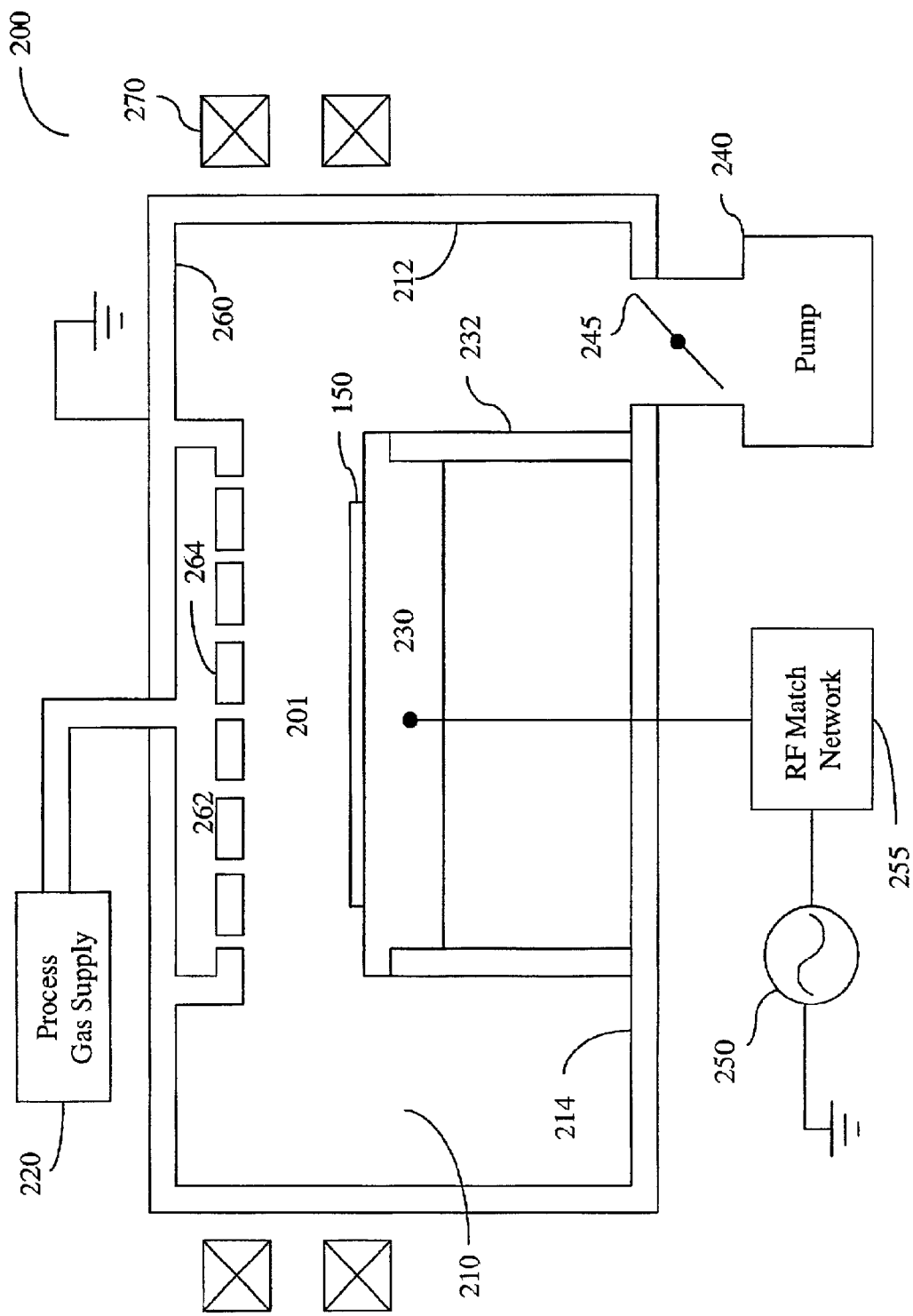
FIG. 2 is schematic view in vertical cross-section of a plasma reactor used to practice a low-k dielectric etching process according to one embodiment of the present invention.

The etching process of the present invention is useful for etching the low-k dielectric layer 120 with good etch rates and high etching selectivities with respect to the mask 110 and the barrier/liner layer 130. As will be described in more detail below, the etching process is performed by exposing the uncovered portion of the low-k dielectric layer 120 to an energized gas, such as a plasma, comprising energetic and reactive species. The plasma is usually generated in a plasma reactor, such as, for example, a magnetically enhanced reactive ion etching (MERIE) reactor 200, commercially available from Applied Materials Inc., Santa Clara, Calif., as illustrated in FIG. 2. The reactor 200 comprises a chamber 210 enclosed by a wall 212, a base 214, and a ceiling 260. The chamber includes a process zone 201 comprising a volume of about 5,000 to about 50,000 $cm^3$. The reactor 200 further comprises a process gas supply 220 that supplies process gases into the chamber 210 through a gas manifold 262 and a gas distribution plate (GDP) 264 at the ceiling 260 of the chamber 210. Spent process gas and volatile etch products are pumped out from the process chamber 210 by a pump 240. A throttle valve 245 controls the pressure in the chamber 210. The wall 212, the base 214, the ceiling 260, and the GDP 264 are usually made of aluminum with anodized aluminum coating on at least the surfaces facing the inside of the chamber 210. The chamber 210 further includes a pedestal 230 that supports the substrate 150 in the chamber 210. The pedestal 230 is electrically isolated from the base 214 by an insulator support ring 232 and is connected to a radio frequency (RF) power source 250 through an impedance match network 255. The wall 212, the base 214, the ceiling 260, and the GDP 264 are typically grounded.

To perform the etching process, the chamber 210 is evacuated by the pump 240 to a pressure of less than about 1 mTorr. The substrate 150 is transferred into the chamber 210 from a load lock transfer chamber (not shown) maintained at near vacuum, and is placed on the pedestal 230. The substrate 150 can be held in place during the etching process using a mechanical or electrostatic chuck (not shown) with grooves in which a coolant gas, such as helium, is circulated to control the temperature of the substrate 150.

Process gases are introduced into the chamber through the GDP 264 above the substrate 150. Once the pressure in the chamber 210 is stabilized at a desired level, the RF power source 250 is turned on to strike a plasma in the process zone 201. With the RF source 250 turned on, the pedestal 230 acts as a cathode electrode, while the grounded wall 212, ceiling 260 and the GDP 264 together serve as an anode electrode. The reactor configuration of FIG. 2 facilitates reactive ion etching (RIE) processes, where RF voltage at a power level of about 100 to about 2000 Watts is applied to the cathode electrode below the substrate 150 while the anode electrode (s) are grounded. The plasma is thus generated and maintained by capacitively coupled RF power between the cathode and the anode electrodes. The plasma density, defined as the number of ions per unit volume, may be enhanced by placing plural magnets 270 around the chamber wall 212 to provide a slowly rotating magnetic field in the chamber 210. The magnets may be electromagnets driven with respective phases of a low frequency (e.g., 0.1–0.5 Hertz) AC current source (not shown). Alternatively, the magnets may be permanent magnets mounted on a slowly rotating support structure (not shown) rotating at, for example, 0.1–0.5 revolutions per second.

FIG. 2 only shows one configuration of the many plasma reactors that can be used to practice the present invention. For example, the reactor 200 may include other power sources in addition to or in place of the RF power source 250, and power can be coupled into the chamber 210 to strike and maintain a plasma therein through differently configured coupling hardware such as known in the art, without affecting the application of the present invention. For example, in addition to the power from the RF power source 250, an RF voltage can be applied to an inductor coil to inductively couple energy into the chamber 210 to maintain a higher plasma density in the process zone 201. The frequency of the RF power applied to the electrode 230 or the inductor coil is typically from about 50 KHz to about 60 MHz, and more typically about 13.56 MHz.

The etching process of the present invention comprises a main etch step that is often followed by an over etch step. FIG. 1(a) depicts the dielectric layer 120 at the beginning of the main etch step, FIG. 1(b) depicts the dielectric layer 120 in the middle of the main etch step, FIG. 1(c) depicts the dielectric layer 120 at the beginning of the over etch step, and FIG. 1(d) depicts the dielectric layer 120 at the end of the over etch step. The main etch step advances the feature bottom surface 106 until it almost reaches the top surface of the barrier/liner layer. During the main etch step, the etching process of the present invention provides high etch rate and highly selective etching of the low-k dielectric layer 120 with respect to the mask 110. The over etch step clears away any residual dielectric layer left in the feature 101, such as, for example, at the bottom corners 109 of the feature 101. During the over etch step, the etching process of the present invention provides high etching selectivity with respect to the barrier/liner layer 130 and reasonable etch rate. The main etch step may run for a time period determined from etch rate data obtained from test runs, or it may run until an endpoint is detected by a conventional optical endpoint measurement device incorporated in the reactor 200.

The process gas used in the etching process comprises fluorocarbon gas, such as $CHF_3$, $C_4F_6$, $C_4F_8$, etc., a nitrogen containing gas, such as $N_2$, $NH_3$, etc., and an inert gas, such as Helium, Argon, Xenon, etc. The fluorocarbon gas contributes fluorine and $CF_x$ species in the plasma that etch the dielectric layer 120 by reacting with the silicon and oxygen content in the dielectric layer 120 to form volatile etch products. For normal dielectrics such as silicon dioxide, the etching reaction may include,

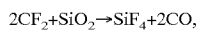

where the etch products $SiF_4$ and CO are both volatile and can be pumped out of the chamber 210. At the same time, some $CF_x$ species (x=1, 2, 3) may form polymeric passivating deposits on the feature surfaces by recombining with each other or with other species before reacting with the dielectric layer. Because the feature sidewalls 105 are subject to less ion bombardment from the plasma than the feature bottom surface 106, these passivating deposits accumulate more on the feature sidewalls 105, resulting in enhanced anisotropic etching.

The more complicated chemical compositions in low-k dielectrics often result in more complicated etch products. For example, for low-k dielectrics such as doped silicon dioxide films containing alkyl groups such as $CH_3$, non-volatile polymer forming species such as $C_\xi H_\zeta F_{72}$ can be part of the etch products that also tend to deposit on the etched feature surfaces, as shown in the following,

where α, β, γ, δ, ε, ψ, ξ, ζ and η are integers.

The fluorocarbon gas can be one or more gases selected from hydrogen-containing fluorocarbons or hydrofluorocarbons, such as, for example, $CH_3F$, $CHF_3$, $C_2HF_5$, $CH_2F_2$, and $C_2H_4F_2$, or fluorocarbons without hydrogen, such as $CF_4$, $C_2F_6$, $C_3F_8$, $C_4F_6$, $C_4F_8$ and $C_4F_{10}$. The fluorocarbon gas can also be a combination of more than one of these gases. Although the gas chemistry is not fully understood, it is believed that in general non-hydrogen-containing fluorocarbons provide more free carbon and $CF_2$ radicals that result in anisotropic etching and increased etching selectivity but low etch rates. It is further believed that the hydro-fluorocarbons (with the exception of $CH_3F$) provide increased etch rates, because these fluorocarbons provide hydrogen-containing species that tend to combine with free carbon radicals or react with carbon containing deposits to form hydrocarbons. The hydrocarbons are typically volatile and are exhausted from the chamber thereby reducing the amount of deposits on the feature surfaces. In one embodiment of the present invention, a fluorocarbon gas selected from a first group comprising $CHF_3$, $C_2HF_5$, $CH_2F_2$, $CF_4$, $C_3F_8$, $C_4F_{10}$, $C_2F_6$, and their combinations, is used in the main etch step for fast etch rate. A fluorocarbon gas selected from a second group comprising $CH_3F$, $C_3F_6$, $C_3F_8$, $C_4F_6$, $C_4F_{10}$, $C_4F_8$, and their combinations, is used in the over etch step for high etching selectivity with respect to the barrier/liner layer 130.

Although sidewall passivation has proved to be helpful in achieving anisotropy, too much etch product deposits on the sidewall can cause problems such as striation, slow etch rate, or even etch stop. Thus the process gas in the main etch step also comprises the nitrogen-containing gas, such as $N_2$, $NH_3$, $N_2O$, etc. The nitrogen-containing gas contributes to the nitrogen containing species in the plasma that react with some of the passivating deposits and etch product deposits on the feature surfaces to form volatile species such as CN that are pumped out from the process chamber 210. One advantage of using nitrogen-containing gas for the removal of deposits is that the nitrogen containing gas has low impact on the mask 110, which is typically made of a photoresist material.

The inert gas also plays an important role in the etching process. The inert gas helps to control the etched feature profile by contributing inert ions that impinge mostly on the bottom surface 106 of the etched features, activating chemical reactions thereon while leaving the sidewalls 105 of the features less affected. The inert ions also help to reduce etch product deposits by sputtering them off the feature surfaces. Suitable inert gases include argon, helium, neon, xenon, and krypton, of which argon is most often used.

The volumetric flow rate of each gas in the process gas depends on many factors, including the configuration of the reactor used to carry out the etching process, the size of the substrate, and the specific gases used in the process gas. The volumetric flow ratios of the different gases in the process gas can also be tailored for different combinations of materials and to achieve specific etching selectivities, etch rates, or feature geometry without deviating from the scope of the present invention. In one embodiment of the present invention, when $CHF_3$ is used as the fluorocarbon gas in the main etch step and $N_2$ is used as the nitrogen-containing gas, the volumetric flow ratio of $CHF_3:N_2$ is about 1:1. Relatively high volumetric flow of the inert gas has been found to achieve optimum profile. In one embodiment of the present invention, when argon is used as the inert gas in the main etch step, the volumetric flow ratio of argon to the fluorocarbon gas is from about 20:1 to 100:1, and more typically from about 40:1 to 80:1. The main etch step provides a low-k dielectric etch rate higher than about 4000 Å/min and etching selectivity with respect to the photoresist mask higher than about 5:1. The volumetric flow ratio of fluorocarbon to nitrogen-containing gas of about 1:1 in the main etch step is also selected so that the sidewalls 105 of the etched feature 101 have smooth surfaces that form desired angles, such as angles between 85° to 90°, with the bottom surfaces 106.

In the over etch step in one embodiment of the present invention, where $C_4F_6$ is used as the fluorocarbon gas and $N_2$ is used as the nitrogen-containing gas, the volumetric flow ratio of fluorocarbon to nitrogen-containing gas is from about 1:18 to about 1:8, and more typically about 1:12.5. The over etch step provides a low-k dielectric etch rate higher than about 2000 Å/min, etching selectivity with respect to the photoresist mask higher than about 3:1, and etching selectivity with respect to the barrier/liner material higher than about 6:1.

Other gases may also be included in the etching process. For example, a small amount of oxygen in the main etch step has been found to be helpful in reducing microloading and enhancing etch uniformity. Also, adding a carbon-oxygen gas such as carbon monoxide (CO) in the process gas in either the main etch step or the over etch step helps to improve the etching selectivity with respect to the underlying barrier/liner layer 130.

EXAMPLES

The following examples illustrate use of the present invention for etching the low-k dielectric layers 120 on a semiconductor substrate 150, such as a silicon wafer of 200 mm (8 inch) or 300 mm (12 inch) diameter. As shown in FIG. 1(a), the wafer 150 is coated successively with a low-k barrier/liner layer 130 having a thickness of about 700 Å, a low-k dielectric layer 120 having a thickness of about 1 micron, and a mask layer 110 of about 5000 Å that is patterned to define features such as feature 101 to be etched.

In the following examples, the mask layer is photoresist, such as "RISTON," manufactured by duPont de Nemours Chemical Company. The low-k dielectric layer is a Black Diamond™ low-k dielectric layer formed with a chemical vapor deposition (CVD) or plasma enhanced CVD process using $SiH_2F_2$ or $CH_3SiH_3$ as a precursor gas. The low-k barrier/liner layer is a BLOk™ (barrier low-k) film, which is a silicon carbide film formed using the chemical vapor deposition (CVD) or plasma enhanced CVD process described in commonly owned U.S. Pat. No. 6,287,990 B1, issued Sep. 11, 2001, and U.S. Pat. No. 6,303,523 B2, issued Oct. 16, 2001, which are incorporated herein by reference. Various layers of the same or other materials may lie under the BLOk™ layer, which should not affect the practice of the present invention.

A thin (600 Å) antireflective coating (ARC) layer (not shown) may lie between the mask layer 110 and the low-k dielectric layer 120. The ARC layer is typically used for line/width control during photolithography when the minimum feature sizes reach below quarter micron. A conventional ARC open process can be performed to clear away the ARC layer at the feature openings before etching the low-k dielectric layer.

During the etching process, the substrate 150 is placed on the pedestal 230 of the reactor 200, and the chamber 210 is maintained at a pressure of about 40–150 mTorr (mT). Process gas comprising the particular gas compositions described below is introduced into the process chamber 210. A plasma is generated in the process zone 201 that etches the dielectric layer 120 on the substrate 150. The plasma is generated by applying a RF voltage to the pedestal 230. A rotating magnetic field (B-field) of about 20–40 Gauss can also be applied to the process zone 201 to enhance the plasma density.

The wafer 150 is maintained at a temperature sufficiently high to volatilize most of the etch products, and sufficiently low so that a layer of passivating deposits and etch product deposits is retained on the sidewalls 105 of freshly etched feature 101. Typically, the substrate 150 is kept at a temperature of about 15° C. using a flow of helium on the backside of the substrate 150. The pressure of the backside helium is maintained at about 16 Torr in the main etch step and at about 8 Torr in the over etch step. The chamber wall 212 is also kept at a temperature of about 15° C. using a conventional cooling or heating mechanism as necessary for maintaining the chamber wall temperature.

The etching process comprises a main etch step followed by an over etch step. The main etch step is performed for a sufficient time to etch through the low-k dielectric layers 120 on the substrate 150, and is terminated after a predetermined time period or by using an optical endpoint measurement technique.

In one embodiment of the present invention, in the main etch step, the RF power applied to the pedestal 230 is in the range of 600–1500 W for 200 mm wafers or 1200–3000 W for 300 mm wafers, and the pressure is in the range of 40–100 mT. The argon flow rate is in the range of 600–1500 standard cubic centimeters per minute (sccm) for 200 mm wafers or 1200–3000 sccm for 300 mm wafers, and the $N_2$ and $CHF_3$ flow rates are each in the range of 10–20 sccm for 200 mm wafers or 20–40 for 300 mm wafers. The $CHF_3:N_2$ flow rate ratio is about 1:1. Table I lists some of the process parameters such as RF power, pressure, process gas composition and flow rates, etc. used to etch low-k dielectrics on a set of 200 mm test wafers in several examples of the present invention.

Scanning electron micrograph (SEM) photos of etched test wafers were used to measure the etch rate, etching selectivity, and etch rate microloading. The etch rate microloading is a measure of the difference in etch rate in features having different sizes, and is calculated as a percent value of the difference between etch rate in a larger feature and etch rate in a smaller feature divided by the etch rate in the larger feature. In the examples herein, etch rate was measured in holes having a diameter of 0.18 micron and etch rate microloading was measured for larger holes having diameters of about 0.28 micron and smaller holes having diameters of about 0.18 micron. Table II lists the results of measurements from the set of 200 mm test wafers etched with the process parameters listed in Table I.

Table III lists some of the process parameters, such as RF power, pressure, process gas composition and flow rates, etc., used to etch low-k dielectrics on 300 mm test wafers in one example of the present invention. Table IV lists part of the results of measurements from the 300 mm test wafers etched with the process parameters listed in Table III.

TABLE I

| | Process Gas flow rate (sccm) | | | Pressure | RF Power | B-field |
|---|---|---|---|---|---|---|
| | $CHF_3$ | $N_2$ | Ar | (mT) | (W) | (G) |
| Example 1 | 15 | 15 | 800 | 100 | 1000 | 40 |
| Example 2 | 15 | 15 | 1000 | 100 | 1000 | 30 |
| Example 3 | 15 | 15 | 600 | 100 | 1000 | 40 |
| Example 4 | 15 | 15 | 800 | 100 | 1200 | 40 |
| Example 5 | 15 | 15 | 800 | 100 | 1500 | 40 |
| Example 6 | 15 | 15 | 800 | 75 | 1000 | 40 |
| Example 7 | 15 | 15 | 800 | 150 | 1000 | 40 |
| Example 8 | 15 | 15 | 800 | 200 | 1000 | 40 |

TABLE II

| | Etch Rate (Å/min) | PR Selectivity | Microloading (%) |
|---|---|---|---|
| Example 1 | 5200 | >10:1 | 3.0 |
| Example 2 | 5000 | >10:1 | 1.8 |
| Example 3 | 5400 | 6.7:1 | 4.8 |
| Example 4 | 5200 | >10:1 | 3.3 |
| Example 5 | 5700 | >10:1 | Large |
| Example 6 | 4100 | >10:1 | 4.2 |
| Example 7 | 5000 | >10:1 | 3.4 |
| Example 8 | Etch Stop | Etch Stop | Large |

TABLE III

| | Process Gas flow rate (sccm) | | | | Pressure | RF Power | B-field |
|---|---|---|---|---|---|---|---|
| | $CHF_3$ | $N_2$ | Ar | CO | (mT) | (W) | (G) |
| Example 9 | 21 | 21 | 1000 | 100 | 100 | 2000 | 10 |

TABLE IV

| | Etch Rate (Å/min) | PR Selectivity | Microloading (%) |
|---|---|---|---|
| Example 9 | 5400 | 7:1 | 15% |

An over etch step typically follows the main etch step to remove the remaining low-k dielectric material in the etched features. In the over etch step, the RF power is in the range of 1000–1600 W for 200 mm wafers or 2000–3200 W for 300 mm wafers, the pressure in the range of 40–100 mT, the CO flow rate in the range of 150–250 sccm for 200 mm wafers or 300–500 sccm for 300 mm wafers, the $N_2$ flow rate in the range of 125–225 sccm for 200 mm wafers or 250–450 sccm for 300 mm wafers, and the $C_4F_6$ flow rate in the range of 10–18 sccm for 200 mm wafers or 20–36 sccm for 300 mm wafers while the $C_4F_6:N_2$ flow ratio is kept in the range of 1:18 to 1:100.

Table V lists some of the process parameters such as RF power, pressure, process gas composition and flow rates, etc. used in two examples of the over etch step. Example 10 is used to etch low-k dielectrics on 200 mm test wafers and example 11 is used to etch low-k dielectrics on 300 mm test wafers. Table VI lists part of the measurement results from the 200 mm and 300 mm test wafers etched with the process parameters in examples 10 and 11, respectively, as listed in

TABLE V

| | Process Gas flow rate (sccm) | | | Pressure | RF Power | B-field |
|---|---|---|---|---|---|---|
| | $C_4F_6$ | $N_2$ | CO | (mT) | (W) | (G) |
| Example 10 | 14 | 175 | 200 | 40 | 1200 | 30 |
| Example 11 | 12 | 100 | 200 | 40 | 3000 | 10 |

TABLE VI

| | Etch Rate (Å/min) | PR Selectivity | BLOk Selectivity | Microloading |
|---|---|---|---|---|
| Example 10 | 3890 | 4.6:1 | 12:1 | 4.3% |
| Example 11 | 3330 | 5.8:1 | 19.2:1 | Not measured |

Because the actual process parameters, such as the RF power, pressure, gas flow rates, etc., are dependent upon the size of the wafer, the volume of the chamber 210, and on other hardware configurations of the reactor 200, the invention is not limited to process parameters or the ranges recited herein.

Figure 3:
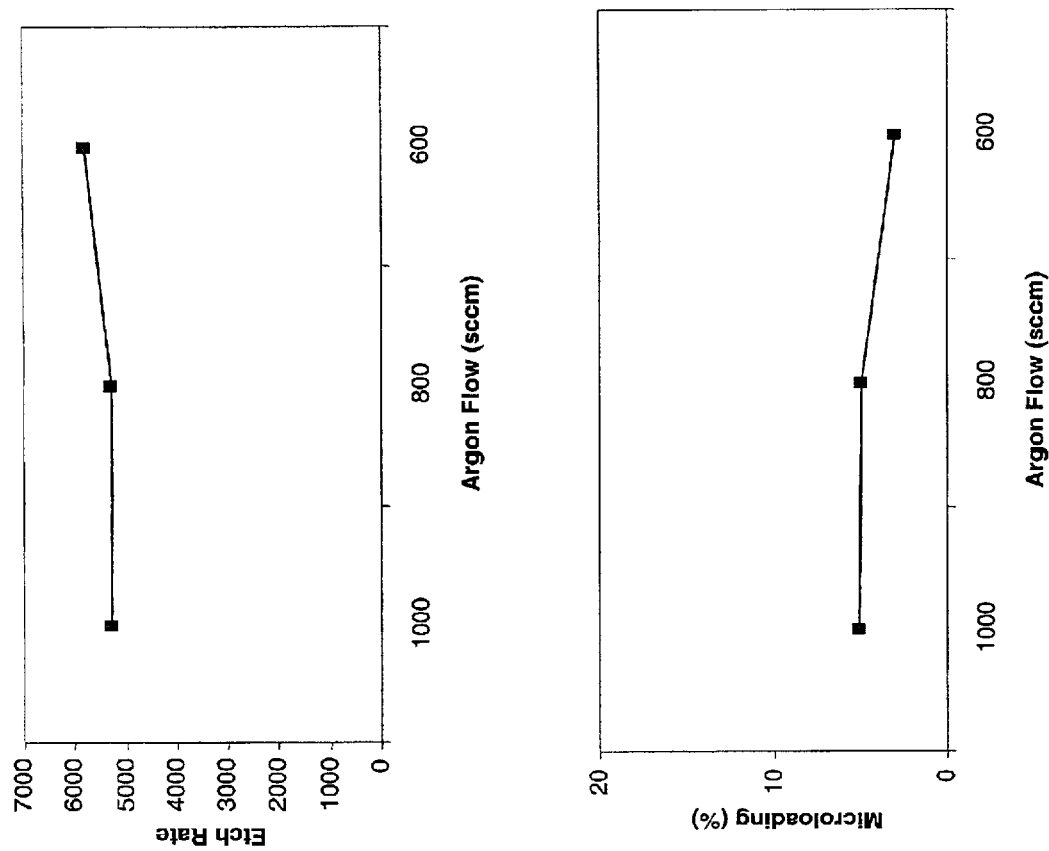
FIG. 3 is a chart showing the trend of change in etch rate and microloading in response to change in Argon flow rate according to one embodiment of the present invention.
Figure 4:
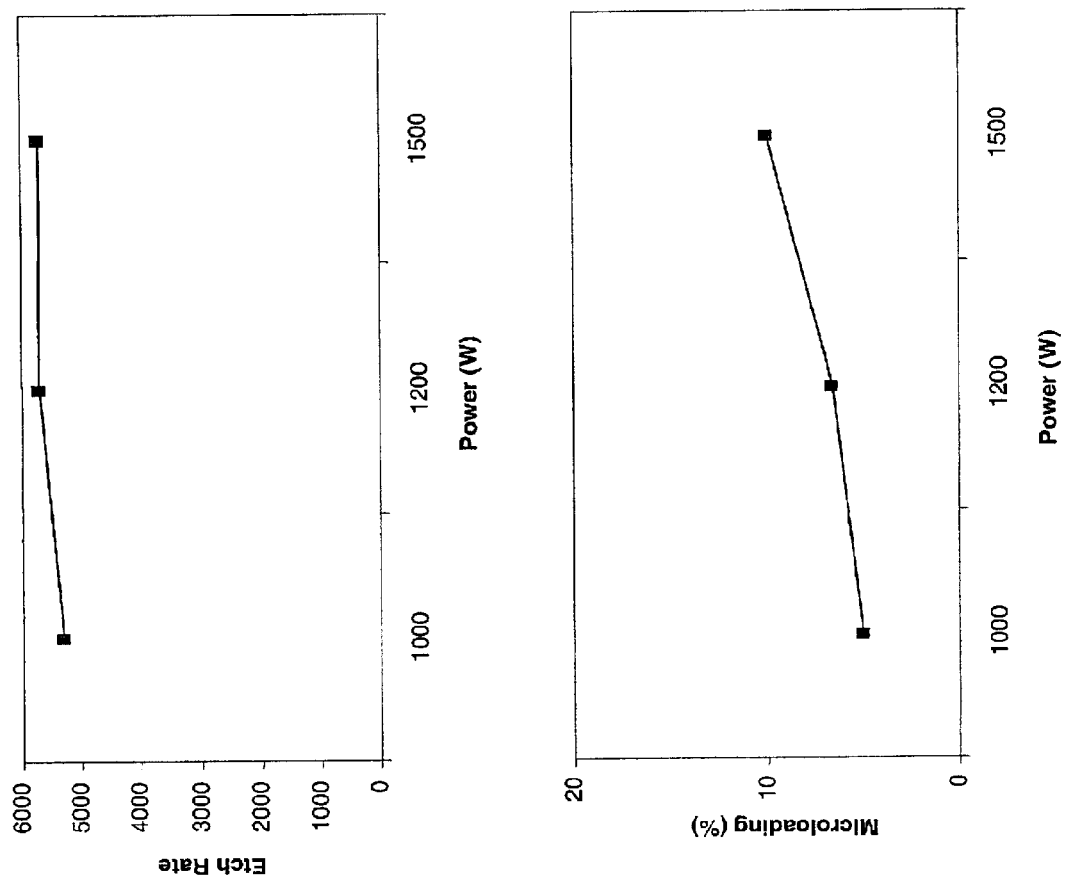
FIG. 4 is a chart showing the trend of change in etch rate and microloading in response to change in RF power according to one embodiment of the present invention.
Figure 5:
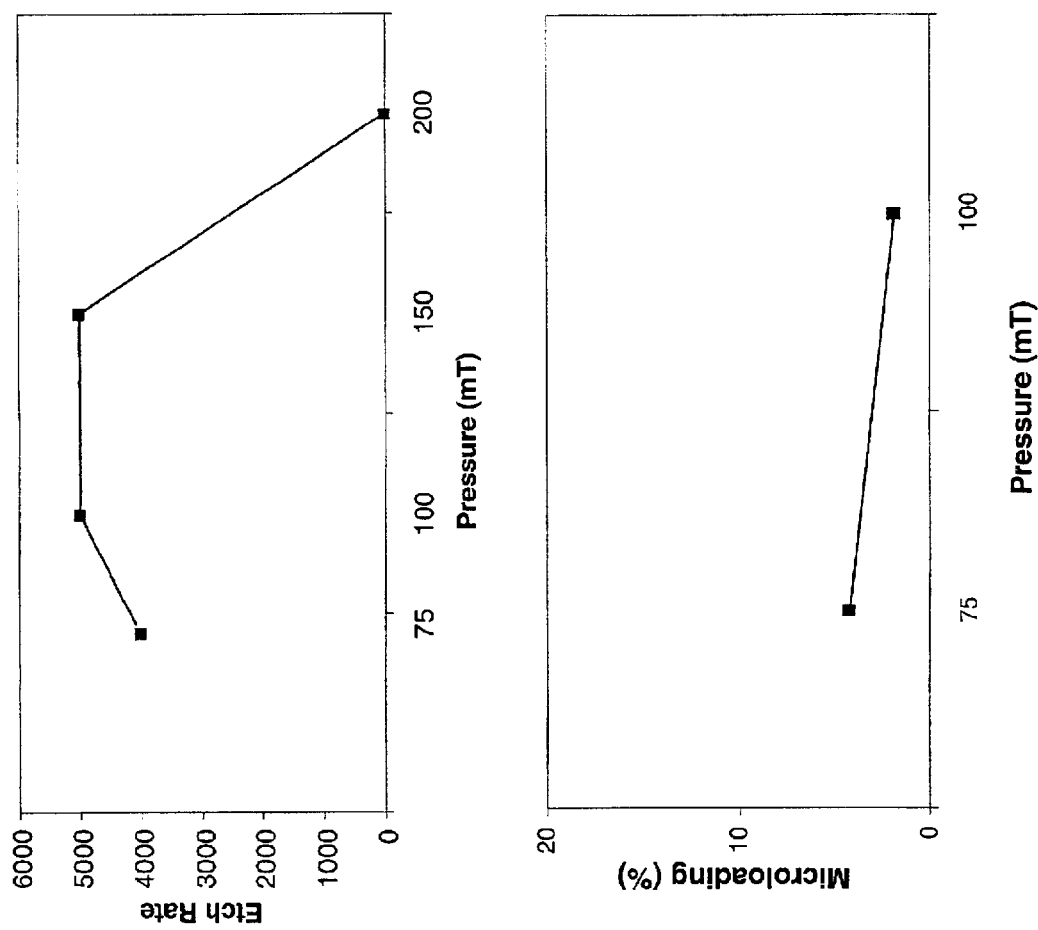
FIG. 5 is a chart showing the trend of change in etch rate and microloading in response to changes in pressure according to one embodiment of the present invention.

FIGS. 3–5 illustrate the trends of change in etch rate and microloading in response to changes in the argon flow rate, RF power, and pressure, respectively, for the main etch step, according to one embodiment of the present invention. As shown in FIG. 3, lower argon flow rate results in increased etch rate and reduced microloading. But there is some sacrifice in etched feature profile with reduced argon flow rate. As shown in FIG. 4, higher RF power results in increased etch rate but increased microloading also. Higher RF power has also been found to result in more faceting of the photoresist mask and bowing of the feature sidewalls 105. As shown in FIG. 5, higher pressure tends to result in decreased microloading. Also, as the pressure goes up, the etch rate tends to increase until it saturates. Further increase in pressure beyond saturation results in decreased etch rate or even etch stop. For all of the process parameter variations shown in FIGS. 3–5, the etching selectivity with respect to the photoresist mask in the main etch step is greater than 10:1.

Adding small amount of oxygen to the process gas in the main etch step has been found to result in better uniformity and less microloading. In order to maintain good selectivity with respect to the photoresist mask, however, the volumetric flow of oxygen used in the main etch step is typically below 8 sccm for 200 mm wafers and 16 sccm for 300 mm wafers.

While the present invention has been described with reference to a few specific embodiments, the description is illustrative of the invention and is not to be construed as limiting the invention. Various modifications may occur to those skilled in the art without departing from the true spirit and scope of the invention as defined by the appended claims.

What is claimed is:

1. A method of plasma etching a low-k dielectric layer on a substrate, comprising:
   providing during a first plasma processing step a first process gas comprising a a fluorocarbon gas, a nitrogen containing gas, and an inert gas, wherein an inert gas/fluorocarbon gas flow ratio is in a range from 20:1 to 100:1; and
   providing during a second plasma processing step a second process gas comprising a fluorocarbon gas and a nitrogen containing gas, wherein a fluorocarbon gas/nitrogen containing gas flow ratio is in a range from 1:18 to 1:10.

2. The method of claim 1 wherein the fluorocarbon gas of the first process gas is selected from the group consisting of $CHF_3$, $C_2HF_5$, $CH_2F_2CF_4$, $C_3F_6$, $C_3F_8$, $C_4F_{10}$, $C_2F_6$, and mixtures thereof.

3. The method of claim 1 wherein the nitrogen containing gas of the first process gas is selected from the group consisting of $N_2$, $NH_3$, $N_2O$, and mixtures thereof.

4. The method of claim 1 wherein the inert gas of the first process gas is selected from the group consisting of argon, xenon, neon, krypton, and helium.

5. The method of claim 1 wherein the first process gas further comprises $CHF_3$, argon, and $N_2$.

6. The method of claim 5 wherein the first process gas has a $CHF_3:N_2$ flow ratio is about 1:1.

7. The method of claim 5 wherein the first process gas has an argon/$CHF_3$ flow ratio in the range of 40:1 to 80:1.

8. The method of claim 1 wherein of the first process gas has the fluorocarbon gas comprises at least one of $C_4F_6$ and $C_3F_6$.

9. The method of claim 1 wherein the low-k dielectric layer is formed using a precursor gas comprising at least one of $SiH_2F_2$ and $CH_3SiH_3$.

10. The method of claim 1 wherein the first process gas and the second process gas are energized to a plasma using an RF bias power between 600–3000 W.

11. The method of claim 1 wherein the pressure of the first process gas or the second process gas is in the range of 40–100 mTorr.

12. The method of claim 1 wherein at least one of the first process gas and the second process gas further comprises CO.

13. The method of claim 1 wherein the first process gas further comprises $O_2$.

14. The method of claim 10 wherein the plasma is rotationally magnetized to about 10–40 Gauss.

15. A method for plasma etching a substrate having a low-k dielectric layer, a low-k barrier/liner layer disposed under the low-k dielectric layer, and a photoresist mask disposed upon the low-k dielectric layer, comprising:
   providing during a first plasma processing step a first process gas comprising a fluorocarbon gas, a nitrogen containing gas, and an inert gas, wherein an inert gas/fluorocarbon gas flow ratio is in a range from 20:1 to 100:1;
   providing during a second plasma processing step a second process gas comprising a fluorocarbon gas and a nitrogen containing gas, wherein a fluorocarbon gas/nitrogen containing gas flow ratio is in a range from 1:18 to 1:10; and
   energizing the first and second process gases with RF power between about 100 to about 3200 watts.

16. The method of claim 15 wherein a fluorocarbon gas/nitrogen-containing gas flow ratio of the first process gas is selected to provide a low-k dielectric to photoresist etching selectivity ratio greater than about 3:1, a low-k dielectric to low-k barrier/liner etching selectivity ratio greater than about 6:1, and a low-k dielectric etch rate greater than about 2000 Å/min.

17. The method of claim 15 wherein the fluorocarbon gas of the first process gas is selected from the group consisting of $CH_3F$, $C_4F_6$, $C_3F_6$, $C_4F_{10}$, $C_4F_8$, and mixtures thereof.

18. The method of claim 15 wherein the nitrogen containing gas of the first process gas is selected from the group consisting of $N_2$, $NH_3$, $N_2O$, and mixtures thereof.

19. The method of claim 15 wherein at least one of said process gases further comprises CO.

20. The method of claim 15 wherein the second process gas comprises $C_4F_8$ and $N_2$.

21. The method of claim 20 wherein a $C_4F_6:N_2$ flow ratio of the first process gas is about 1:12.5.

22. The method of claim 15 wherein the fluorocarbon gas of the first process gas comprises at least one of $C_4F_6$ and $C_3F_6$.

23. The method of claim 15 wherein the second process gas is energized using less RF power than used to energize the first process gas.

24. The method of claim 15 wherein the low-k barrier/liner layer comprises silicon carbide.

25. The method of claim 15 wherein the low-k dielectric layer is formed using a precursor gas comprising at least one of $SiH_2F_2$ and $CH_3SiH_3$.

26. The method of claim 15 wherein the first process gas further comprises $O_2$.

27. The method of claim 23 wherein the plasma is rotationally magnetized to about 10–40 Gauss.

28. A method of plasma etching a low-k dielectric layer on substrate, comprising:

providing during a first plasma processing step a first process gas comprising a fluorocarbon gas, a nitrogen containing gas and an inert gas: and providing during a second plasma processing step a second process gas comprising a fluorocarbon gas and a nitrogen containing gas.

29. The method of claim 28 wherein an inert gas/fluorocarbon gas flow ratio is in a range from 20:1 to 100:1 during the first plasma processing step.

30. The method of claim 28 wherein a fluorocarbon gas/nitrogen containing gas flow ratio is in a range from 1:18 to 1:10 during the second plasma processing step.

31. The method of claim 28 wherein at least one of the first process gas and the second process gas further comprises CO.

32. The method of claim 28 wherein the first process gas further comprises $O_2$.

* * * * *

UNITED STATES PATENT AND TRADEMARK OFFICE
CERTIFICATE OF CORRECTION

PATENT NO. : 6,897,154 B2
APPLICATION NO. : 10/172243
DATED : May 24, 2005
INVENTOR(S) : Terry Leung et al.

It is certified that error appears in the above-identified patent and that said Letters Patent is hereby corrected as shown below:

Title page,
Item [76], Inventors, delete "Regeny" and insert -- Regency --.
Insert Item -- [73] Assignee: Applied Materials, Inc., Santa Clara, CA (US) --.

Column 2,
Line 31, delete "200" and insert -- 2000 --.

Column 4,
Line 60, delete "$C_\xi H_\zeta F_{72}$" and insert -- $C_\xi H_\zeta F_\eta$ --.
Line 63, delete "$_\epsilon SiF4+\psi CO+C_{86}H_\zeta F_{72}$" and insert -- $\epsilon SiF4+\psi CO+C_\xi H_\zeta F_\eta$ --.

Column 5,
Line 3, after "$C_2F_6$," insert -- $C_3F_6$, --.

Column 6,
Line 32, delete "Åthat" and insert -- Å that --.

Column 8,
Line 45, delete "1:100" and insert -- 1:10 --.

Column 9,
Table VI, column 2, row 2, delete "3890" and insert -- 3800 --.
Line 52, delete "a" before "fluorocarbon".
Line 63, delete "$CH_2F_2CF_4$" and insert -- $CH_2F_2$, $CF_4$ --.

Column 10,
Line 18, after "wherein" insert -- the fluorocarbon gas --.
Line 19, delete "has the fluorocarbon gas" before "comprises".
Line 62, delete "$C_3F_6$" and insert -- $C_3F_8$ --.

Column 11,
Line 2, delete "$C_4F_8$" and insert -- $C_4F_6$ --.
Line 21, insert -- a -- before "substrate".

UNITED STATES PATENT AND TRADEMARK OFFICE
CERTIFICATE OF CORRECTION

PATENT NO. : 6,897,154 B2
APPLICATION NO. : 10/172243
DATED : May 24, 2005
INVENTOR(S) : Terry Leung et al.

It is certified that error appears in the above-identified patent and that said Letters Patent is hereby corrected as shown below:

Column 12,
Line 3, after "containing gas" insert -- , --.
Line 3, delete "gas:" and insert -- gas; --.
Line 8, after "claim 28" insert -- , --.
Line 11, after "claim 28" insert -- , --.

Signed and Sealed this

Twentieth Day of June, 2006

JON W. DUDAS
*Director of the United States Patent and Trademark Office*

UNITED STATES PATENT AND TRADEMARK OFFICE
CERTIFICATE OF CORRECTION

PATENT NO.       : 6,897,154 B2
APPLICATION NO. : 10/172243
DATED            : May 24, 2005
INVENTOR(S)      : Terry Leung et al.

It is certified that error appears in the above-identified patent and that said Letters Patent is hereby corrected as shown below:

On the face page, in field (76), under "Inventors", in column 1, line 5, delete "Regeny"
and insert - - Regency - -, therefor.

On the face page, in column 1, above "(*)  Notice:", insert – (73)  Assignee: Applied Materials, Inc., Santa Clara, CA (US) --.

In column 2, line 31, delete "200" and insert - - 2000 - -, therefor.

In column 4, line 60, delete "$C_\xi H_\zeta F_{72}$" and insert - - $C_\xi H_\zeta F_\eta$ - -, therefor.

In column 4, line 63, delete "$\varepsilon SiF4 + \psi CO + C_{86}H_\zeta F_{72}$" and insert
- - $\varepsilon SiF4 + \psi CO + C_\xi H_\zeta F_\eta$ - -, therefor.

In column 5, line 3, after "$C_2F_6$," insert - - $C_3F_6$, - -, therefor.

In column 6, line 32, delete "Åthat" and insert - - Å that - -, therefor.

In column 8, line 45, delete "1:100" and insert - - 1:10 - -, therefor.

In column 9, under "Table VI", column 2, row 2, delete "3890" and insert - - 3800 - -, therefor.

In column 9, line 52, in Claim 1, delete "a" before "fluorocarbon".

In column 9, line 63, in Claim 2, delete "$CH_2F_2CF_4$" and insert
-- $CH_2F_2$, $CF_4$ --.

In column 10, line 18, in Claim 8, after "wherein" insert
-- the fluorocarbon gas --.

In column 10, line 19, in Claim 8, delete "has the fluorocarbon gas" before "comprises".

In column 10, line 62, in Claim 17, delete "$C_3F_6$" and insert -- $C_3F_8$ --, therefor.

In column 11, line 2, in Claim 20, delete "$C_4F_8$" and insert -- $C_4F_6$ --, therefor.

In column 11, line 21, in Claim 28, insert -- a -- before "substrate".

UNITED STATES PATENT AND TRADEMARK OFFICE
CERTIFICATE OF CORRECTION

PATENT NO.         : 6,897,154 B2
APPLICATION NO.  : 10/172243
DATED              : May 24, 2005
INVENTOR(S)        : Terry Leung et al.

It is certified that error appears in the above-identified patent and that said Letters Patent is hereby corrected as shown below:

In column 12, line 3, in Claim 28, after "containing gas" insert -- , --.

In column 12, line 3, in Claim 28, delete "gas:" and insert -- gas; --, therefor.

In column 12, line 8, in Claim 29, after "claim 28" insert -- , --.

In column 12, line 11, in Claim 30, after "claim 28" insert – , --.

Signed and Sealed this

Twenty-ninth Day of August, 2006

JON W. DUDAS
*Director of the United States Patent and Trademark Office*